(12) United States Patent
Minixhofer et al.

(10) Patent No.: US 9,947,711 B2
(45) Date of Patent: Apr. 17, 2018

(54) SEMICONDUCTOR DEVICE WITH SURFACE INTEGRATED FOCUSING ELEMENT AND METHOD OF PRODUCING A SEMICONDUCTOR DEVICE WITH FOCUSING ELEMENT

(71) Applicant: ams AG, Unterpremstaetten (AT)

(72) Inventors: Rainer Minixhofer, Unterpremstaetten (AT); Martin Schrems, Eggersdorf (AT); Sara Carniello, Graz (AT)

(73) Assignee: AMS AG, Unterpremstaetten (AT)

(*) Notice: Subject to any disclaimer, the term of this patent is extended or adjusted under 35 U.S.C. 154(b) by 0 days.

(21) Appl. No.: 15/119,377

(22) PCT Filed: Feb. 10, 2015

(86) PCT No.: PCT/EP2015/052765
§ 371 (c)(1),
(2) Date: Aug. 16, 2016

(87) PCT Pub. No.: WO2015/124465
PCT Pub. Date: Aug. 27, 2015

(65) Prior Publication Data
US 2017/0062504 A1  Mar. 2, 2017

(30) Foreign Application Priority Data
Feb. 18, 2014 (EP) .................................. 14155574

(51) Int. Cl.
*H01L 27/146* (2006.01)
*H01L 31/0203* (2014.01)
*H01L 31/02* (2006.01)
*H01L 27/32* (2006.01)

(52) U.S. Cl.
CPC ...... *H01L 27/1464* (2013.01); *H01L 27/1469* (2013.01); *H01L 27/14618* (2013.01);
(Continued)

(58) Field of Classification Search
CPC ......... H01L 27/14618; H01L 27/14627; H01L 27/14629; H01L 27/14632;
(Continued)

(56) References Cited

U.S. PATENT DOCUMENTS 5,900,637 A * 5/1999 Smith ................. G03F 7/70291
250/492.22
6,012,336 A * 1/2000 Eaton .................. B81C 1/00246
73/754

(Continued)

FOREIGN PATENT DOCUMENTS

KR  1020130010847  1/2013
WO  2014180635 A1  11/2014

*Primary Examiner* — Sophia Nguyen
(74) *Attorney, Agent, or Firm* — McDermott Will & Emery LLP (57) ABSTRACT

The semiconductor device comprises a semiconductor substrate (1), a sensor or sensor array (2) arranged at a main surface (10) of the substrate, an integrated circuit (3) arranged at or above the main surface, and a focusing element (17) comprising recesses (4) formed within a further main surface (11) of the substrate opposite the main surface. The focusing element may be arranged opposite the sensor or sensor array (2), which may be a photosensor or photodetector or an array of photosensors or photodetectors, for instance. The focusing element (17) is formed by etching the recesses (4) into the semiconductor material.

16 Claims, 5 Drawing Sheets

(52) U.S. Cl.
CPC .. *H01L 27/14627* (2013.01); *H01L 27/14629* (2013.01); *H01L 27/14632* (2013.01); *H01L 27/14634* (2013.01); *H01L 27/14649* (2013.01); *H01L 27/14687* (2013.01); *H01L 27/14689* (2013.01); *H01L 27/3269* (2013.01); *H01L 31/0203* (2013.01); *H01L 31/02016* (2013.01); *H01L 27/14645* (2013.01); *H01L 2924/1815* (2013.01)

(58) Field of Classification Search
CPC ....... H01L 27/14634; H01L 2924/1815; H01L 27/3269; H01L 27/14645; H01L 27/1464; H01L 27/14649; H01L 27/14689; H01L 27/1469; H01L 31/0203; H01L 31/0481; H01L 31/02168; H01L 31/02164; H01L 31/02016; H01L 25/0655; H01L 25/042; H01L 25/047; H01L 51/448
See application file for complete search history.

(56) References Cited

U.S. PATENT DOCUMENTS

| | | | | |
|---|---|---|---|---|
| 6,894,292 | B2* | 5/2005 | Gil | G03F 7/70391 250/492.2 |
| 7,279,731 | B1* | 10/2007 | Bui | H01L 31/0236 257/292 |
| 9,068,917 | B1* | 6/2015 | Vaez-Iravani | G01N 21/00 |
| 9,543,245 | B2* | 1/2017 | Schrank | H01L 24/94 |
| 2003/0183921 | A1* | 10/2003 | Komobuchi | B81B 7/0077 257/704 |
| 2004/0208466 | A1* | 10/2004 | Mossberg | G02B 5/203 385/129 |
| 2005/0212132 | A1 | 9/2005 | Hsuan et al. | |
| 2005/0263805 | A1* | 12/2005 | Mouli | H01L 27/14609 257/292 |
| 2006/0145056 | A1* | 7/2006 | Jung | H01L 27/14625 250/208.1 |
| 2006/0145207 | A1* | 7/2006 | Kim | H01L 27/14609 257/292 |
| 2006/0183059 | A1* | 8/2006 | Menon | G03F 7/203 430/322 |
| 2007/0280626 | A1* | 12/2007 | Haddock | G01S 11/12 385/147 |
| 2008/0011937 | A1* | 1/2008 | Toshikiyo | H01L 27/14625 250/208.1 |
| 2008/0237761 | A1 | 10/2008 | Fu et al. | |
| 2008/0251872 | A1* | 10/2008 | Kwon | H01L 27/14618 257/432 |
| 2008/0261346 | A1* | 10/2008 | Yang | H01L 27/14618 438/65 |
| 2009/0200625 | A1* | 8/2009 | Venezia | H01L 27/1463 257/432 |
| 2009/0224351 | A1* | 9/2009 | Hsieh | H01L 27/14609 257/444 |
| 2010/0051790 | A1* | 3/2010 | Park | H01L 27/14621 250/227.2 |
| 2010/0053407 | A1* | 3/2010 | Crisp | H01L 27/14618 348/311 |
| 2010/0194532 | A1* | 8/2010 | Kaule | G02B 27/60 340/5.86 |
| 2010/0208036 | A1* | 8/2010 | Kaule | B44F 1/10 348/46 |
| 2010/0297804 | A1* | 11/2010 | Chang | H01L 27/14627 438/70 |
| 2011/0037883 | A1* | 2/2011 | Lee | H01L 27/14623 348/273 |
| 2011/0089517 | A1* | 4/2011 | Venezia | H01L 27/14603 257/447 |
| 2011/0147869 | A1* | 6/2011 | Lazarov | G01J 5/02 257/432 |
| 2011/0147872 | A1* | 6/2011 | Inoue | G02B 5/1814 257/432 |
| 2011/0228142 | A1* | 9/2011 | Brueckner | H04N 5/3572 348/241 |
| 2011/0304008 | A1* | 12/2011 | Yang | H01L 23/3128 257/506 |
| 2012/0007198 | A1* | 1/2012 | Lin | H01L 27/1464 257/432 |
| 2012/0193741 | A1* | 8/2012 | Borthakur | H01L 27/14621 257/433 |
| 2012/0199925 | A1* | 8/2012 | Oganesian | H01L 27/14609 257/432 |
| 2012/0199926 | A1* | 8/2012 | Oganesian | H01L 27/14625 257/432 |
| 2013/0020665 | A1* | 1/2013 | Oganesian | H01L 27/14618 257/432 |
| 2013/0038942 | A1* | 2/2013 | Holmes | B42D 25/351 359/619 |
| 2013/0062502 | A1* | 3/2013 | Kautzsch | H01L 31/062 250/206 |
| 2013/0062719 | A1* | 3/2013 | Kang | G02B 6/4206 257/432 |
| 2013/0063641 | A1* | 3/2013 | Venezia | H01L 27/14627 348/308 |
| 2013/0134535 | A1 | 5/2013 | Lenchenkov | |
| 2013/0168791 | A1* | 7/2013 | Oganesian | H01L 27/14618 257/432 |
| 2013/0206962 | A1* | 8/2013 | Barr | H01L 27/14601 250/208.1 |
| 2013/0242155 | A1* | 9/2013 | Oganesian | H04N 5/374 348/308 |
| 2013/0249031 | A1* | 9/2013 | Oganesian | H01L 27/14627 257/432 |
| 2013/0277785 | A1* | 10/2013 | Chen | H01L 27/14632 257/432 |
| 2013/0292787 | A1* | 11/2013 | Yang | H01L 27/14618 257/432 |
| 2014/0002700 | A1* | 1/2014 | Oishi | H04N 5/369 348/273 |
| 2014/0139839 | A1* | 5/2014 | Medhat | G01J 3/45 356/450 |
| 2014/0168398 | A1* | 6/2014 | Guo | G02B 27/0075 348/77 |
| 2014/0354952 | A1* | 12/2014 | Verly | G02B 27/0093 351/206 |
| 2014/0376091 | A1* | 12/2014 | Jordan | B29D 11/00278 359/567 |
| 2015/0061280 | A1* | 3/2015 | Power | G02B 5/1828 283/85 |
| 2015/0116527 | A1* | 4/2015 | Rossi | H04N 3/1593 348/218.1 |
| 2015/0187972 | A1* | 7/2015 | Kawaguchi | H01L 31/035236 257/14 |
| 2015/0228689 | A1* | 8/2015 | Lenchenkov | H01L 27/14649 257/432 |
| 2015/0255501 | A1* | 9/2015 | Murano | H01L 27/14607 257/292 |
| 2016/0104741 | A1* | 4/2016 | Enichlmair | G01J 5/048 257/49 |
| 2016/0109700 | A1* | 4/2016 | Huang | G01J 9/00 359/239 |
| 2016/0131901 | A1* | 5/2016 | Huang | G02B 26/06 250/201.9 |
| 2016/0195822 | A1* | 7/2016 | Van De Kerkhof | G03F 7/70275 355/72 |
| 2016/0276394 | A1* | 9/2016 | Chou | H01L 27/14645 |
| 2016/0307941 | A1* | 10/2016 | Cheng | H01L 27/1463 |
| 2016/0307943 | A1* | 10/2016 | Cheng | H01L 27/1464 |
| 2016/0345875 | A1* | 12/2016 | Schimmoeller | A61B 5/6847 |
| 2017/0062504 | A1* | 3/2017 | Minixhofer | H01L 27/14618 |
| 2017/0069679 | A1* | 3/2017 | Sargent | H01L 27/1461 |
| 2017/0083745 | A1* | 3/2017 | Goodelle | G06K 9/0004 |

* cited by examiner

SEMICONDUCTOR DEVICE WITH SURFACE INTEGRATED FOCUSING ELEMENT AND METHOD OF PRODUCING A SEMICONDUCTOR DEVICE WITH FOCUSING ELEMENT

BACKGROUND OF THE INVENTION

The invention relates to wafer-level integration of focusing elements in semiconductor devices like optical sensors. Conventional focusing elements, usually lenses, are discrete elements arranged in the package of the device. They require a lot of space and increase the packaging costs.

US 2008/0237761 A1 discloses a system and a method for enhancing light sensitivity of a back-side illumination image sensor. An integrated circuit includes a substrate and an image sensor device comprising at least one transistor formed over a first surface of the substrate and a photosensitive region. A color filter is disposed over an opposite second surface of the substrate. A micro-lens structure is disposed between the second substrate surface and the color filter.

US 2005/0212132 A1 discloses a chip package including a rigid cover disposed above the active surface of the chip to protect the chip and to enhance the structural strength of the chip package. The rigid cover exposes a plurality of bond pads, which are arranged on the active surface of the chip and carry conductive bumps. The height of the bumps above the surface is larger than the height of the rigid cover.

US 2008/0011937 A1 discloses a solid-state imaging device comprising a distributed index lens formed of $SiO_2$, a Si photodiode, wiring conductors and signal transmitting units.

US 2008/0261346 A1 discloses a semiconductor image device package comprising a microlens area formed on a die.

US 2013/0134535 A1 discloses a backside image sensor pixel. STI structures are used to form a backside focusing microlens as an integral part of a silicon substrate provided with photodiodes and transistors in a front surface.

US 2013/0168791 A1 discloses a back side illuminated CMOS image sensor comprising a substrate, a plurality of photo detectors and a plurality of microlenses on the bottom of a recess in the back surface. Additional circuitry on the chip may be included to amplify the voltage, and/or convert it to digital data.

SUMMARY OF THE INVENTION

The focusing element is formed within the rear surface of a semiconductor substrate or wafer with integrated components, which can be manufactured at the front side by a standard CMOS process, for instance. The focusing element does not occupy an additional volume of the device. Manufacturing requires only few additional process steps. The focusing element can be applied to sensor devices conventionally comprising a lens (infrared sensors, for instance) as a compact and cheap way of implementing integrated optics. The performance of many sensor devices (especially photodiodes, for instance) can be enhanced by the focusing element. The proposed focusing element is especially favorable in conjunction with photosensors that detect radiation in a wavelength range where silicon is transparent (typically infrared radiation).

The semiconductor device comprises a semiconductor substrate, a sensor or sensor array arranged at a main surface of the substrate, an integrated circuit arranged at or above the main surface, and a focusing element provided by recesses formed within the semiconductor material of the substrate at a further main surface of the substrate opposite the main surface.

The focusing element may be arranged opposite the sensor or sensor array, which may be a photosensor or photodetector or an array of photosensors or photodetectors, for instance. In particular, each of the recesses of the focusing element may be provided for more than one of the photosensors or photodetectors. The focusing element may especially be provided for an entire sensor array.

The integrated circuit may be arranged in the semiconductor substrate.

Bump contacts may be arranged at or above the main surface of the semiconductor substrate. The bump contacts can be provided for external electrical connections.

In an embodiment of the semiconductor device, the focusing element is a diffracting element.

In a further embodiment, the focusing element is a zone plate comprising a set of radially symmetric Fresnel zones.

In a further embodiment, a covering layer is present on the focusing element to generate a phase shift zone plate.

In a further embodiment, the focusing element is a Fresnel lens.

In a further embodiment, a covering layer is provided, which covers the focusing element without filling the recesses. The covering layer may be a conformal antireflective coating.

In a further embodiment, a cover is arranged at or above the main surface, especially to cover the sensor or sensor array. In particular, openings may be provided in the cover for the accommodation of bump contacts. The integrated circuit may be arranged in the cover.

In a further embodiment, a cavity is provided at the main surface of the substrate, and the sensor or sensor array is arranged in the cavity. In particular, a cover may be arranged at or above the main surface to cover or close the cavity.

The method of producing a semiconductor device with focusing element comprises arranging a sensor or sensor array at a main surface of a semiconductor substrate, providing an integrated circuit at or above the main surface, and etching a focusing element in the semiconductor material of the substrate at a further main surface of the substrate opposite the main surface.

In a variant of the method, the focusing element is etched in the shape of a zone plate or Fresnel lens.

In a further variant of the method, a cover is applied to the main surface, before the focusing element is etched. The cover may be rigid and can be a further semiconductor substrate or wafer, for instance, which may comprise the integrated circuit. The cover can be provided to cover the sensor or sensor array or a cavity wherein the sensor or sensor array is arranged.

In a further variant of the method, the cover is provided with openings for bump contacts. The bump contacts can be provided for external electrical connections.

In a further variant of the method, a cavity is provided at the main surface of the substrate, the sensor or sensor array is arranged in the cavity, and the cover is provided to cover or close the cavity.

The following is a detailed description of examples of the semiconductor device and of examples of the method for producing the semiconductor device.

DETAILED DESCRIPTION

Figure 1:
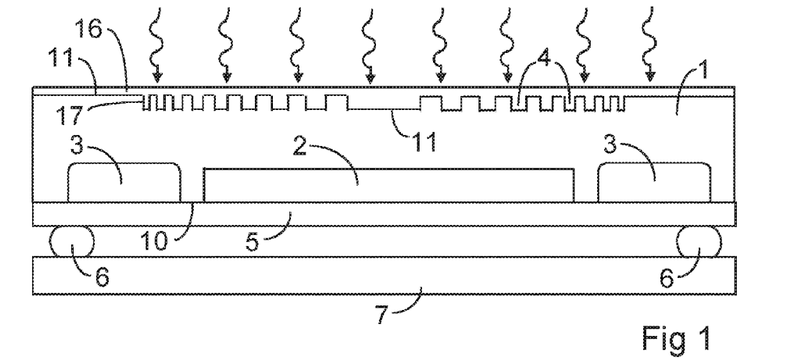
FIG. 1 is a cross section of an embodiment of the semiconductor device comprising a sensor or sensor array.

FIG. 1 is a cross section of an embodiment of the semiconductor device comprising a semiconductor substrate 1 with a main surface 10 and a further main surface 11 opposite the main surface 10. A sensor or sensor array 2, which may be a photodetector or an array of photodetectors, for instance, and an integrated circuit 3 are arranged at or near the main surface 10. The integrated circuit 3 can be provided for the operation of the sensor or sensor array 2. Details of the sensor or sensor array 2 and of the integrated circuit 3 are not essential and are not represented in the figures.

A focusing element 17 comprising recesses 4 is arranged within the further main surface 11, optionally in a position opposite the sensor or sensor array 2. A wiring layer 5, which may comprise several structured metal layers embedded in intermetal dielectric, can be provided on the main surface 10 as a wiring of the integrated circuit 3. Optional bump contacts 6, which may be solder balls, for instance, can be arranged on contact areas or pads of the wiring layer 5 to provide external electrical connections. The semiconductor device can be mounted on a board 7, which may be a printed circuit board (PCB), for instance, by connecting the bump contacts 6 to contact areas or pads of the board 7.

As the recesses 4 of the focusing element 17 are formed within the further main surface 11, the focusing element 17 does not require any additional volume, and the dimensions of the semiconductor device are therefore extremely small. The focusing element 17 can be provided with a covering layer 16, which may be an antireflective coating (AR), for instance. The covering layer 16 may especially planarize the focusing element 17, as shown in FIG. 1. The structure of recesses 4 forming the focusing element 17 may instead be left uncovered. The focusing element 17 can be formed as a diffracting element, in particular as a zone plate comprising a set of radially symmetric Fresnel zones, which are spaced to generate constructive interference at the desired focus. Zone plates and their application to semiconductor devices are known per se. The Fresnel zones of the focusing element 17 are formed by recesses 4 in the shape of concentric circular trenches of suitably varying diameters, widths and distances. A covering layer 16 of a suitable refractive material can be applied to fill the trenches, as shown in FIG. 1, in order to produce a phase shift zone plate, wherein half wavelength phase delays are created between adjacent ring zones. The elevated regions located between the trenches can be provided with suitably sloping surfaces to form a Fresnel lens, which is also known per se from conventional optical devices and need not be described in detail.

A plurality of semiconductor devices as shown in FIG. 1 can be produced on a wafer. A front side of the wafer is processed to form the sensors and the appertaining electronic circuits, which may especially be CMOS circuits, and the backside of the wafer is etched to produce focusing elements for each of the sensors or sensor arrays. An arrangement of a plurality of sensors in an array can especially be applied for image detection, for example. In this case a plurality of focusing elements may be arranged in a corresponding array opposite the sensors forming the array. In particular, one focusing element may be provided for more than one sensor. One focusing element may especially be provided for an entire array of sensors.

Figure 2:
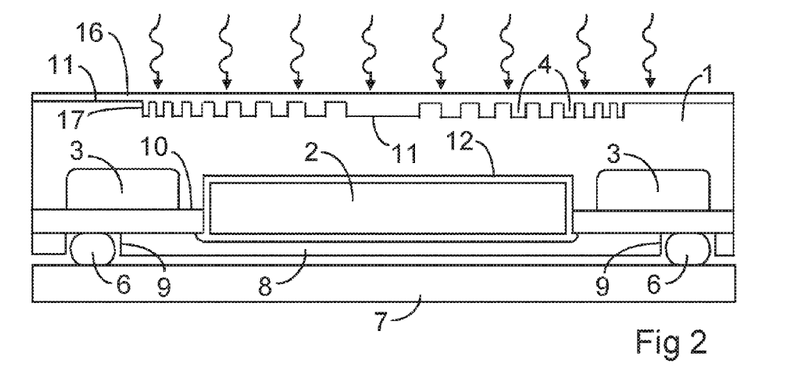
FIG. 2 is a cross section of a further embodiment of the semiconductor device comprising a cover above the sensor or sensor array.

FIG. 2 is a cross section of a further embodiment of the semiconductor device. Elements of the embodiment according to FIG. 2 that correspond to elements of the embodiment according to FIG. 1 are designated with the same reference numerals. The embodiment according to FIG. 2 comprises a cover 8 on or above the main surface 10 of the semiconductor substrate 1. The cover 8 may be rigid and may be a further semiconductor substrate or wafer, for instance. If the sensor or sensor array 2 is arranged in a cavity 12 of the substrate 1, the cover 8 can be provided to cover or close the cavity 12. If external electrical connections are to be formed by bump contacts, openings 9 are provided in the cover 8 for the accommodation of the bump contacts 6. The height of the bump contacts 6 has to exceed the height of the cover 8 at least slightly to allow the bump contacts 6 to be connected to contact areas or pads of the board 7. The depth of the openings 9 is typically not larger than about 100 µm.

Figure 3:
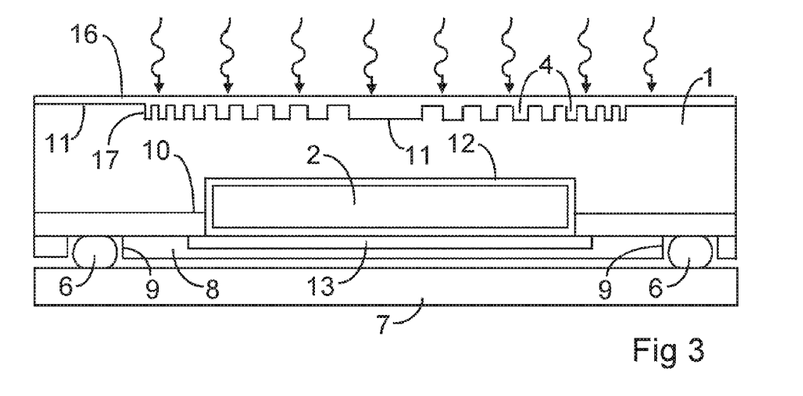
FIG. 3 is a cross section of a further embodiment of the semiconductor device comprising an integrated circuit arranged in a cover above the sensor or sensor array.

FIG. 3 is a cross section of a further embodiment of the semiconductor device. Elements of the embodiment according to FIG. 3 that correspond to elements of the embodiment according to FIG. 2 are designated with the same reference numerals. The embodiment according to FIG. 3 comprises a cover 8 on or above the main surface 10 of the semiconductor substrate 1. The cover 8 is a further semiconductor substrate or wafer, which is provided with an integrated circuit 13. The substrate 1 may also comprise an integrated circuit 3, as in the embodiment according to FIG. 2. Instead, the integrated circuit 13 of the cover 8 may be the only integrated circuit, as shown in the example of FIG. 3. If no integrated circuit 3 is required in the substrate 1, the lateral dimensions of the semiconductor device are extremely small. This is especially advantageous if the lateral dimensions of the sensor or sensor array 2 are to be larger than in the examples shown in FIGS. 1 and 2.

Figure 4:
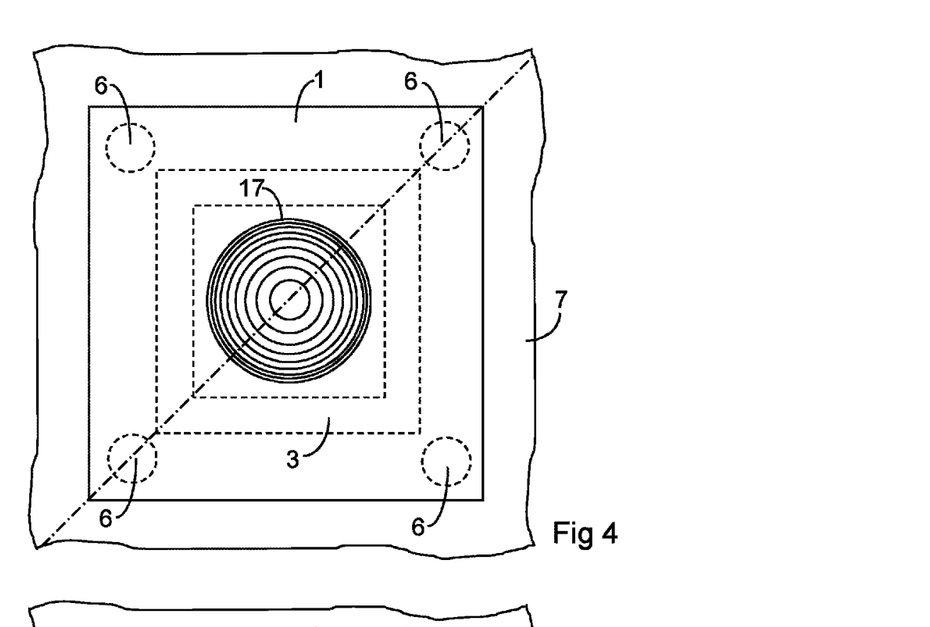
FIG. 4 is a top view of the embodiment shown in FIG. 1.

FIG. 4 is a top view of the embodiment according to FIG. 1 or 2. A single semiconductor device is mounted on the board 7. The hidden contours of the integrated circuit 3 arranged in the semiconductor substrate 1 and of the bump contacts 6 are indicated with broken lines. In the embodiment according to FIG. 1 or 2 and FIG. 4, the integrated circuit 3 surrounds the sensor or sensor array 2, which is located opposite the focusing element 17. In FIG. 4 the focusing element 17 is represented as a zone plate, but other structures are not meant to be excluded. The dash-dotted diagonal line indicates the position of the cross sections of FIGS. 1 and 2.

Figure 5:
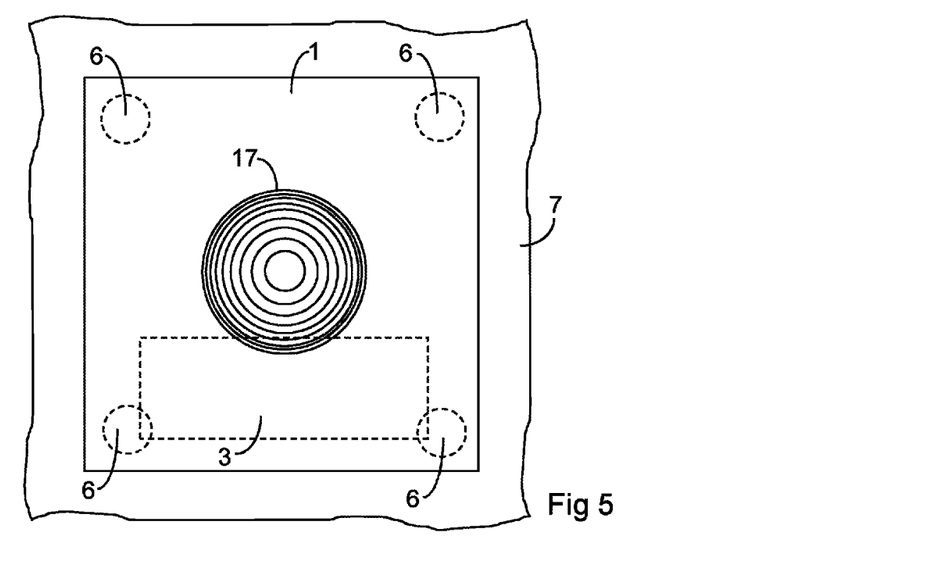
FIG. 5 is a top view of a further embodiment.

FIG. 5 is a top view of a further embodiment, which differs from the embodiment according to FIG. 4 in the arrangement of the integrated circuit 3. In the embodiment according to FIG. 5, the integrated circuit 3 is confined to one side of the sensor or sensor array 2. The arrangement of the integrated circuit 3 may be varied according to individual requirements. The number and positions of the bump contacts 6 may also vary.

Figure 6:
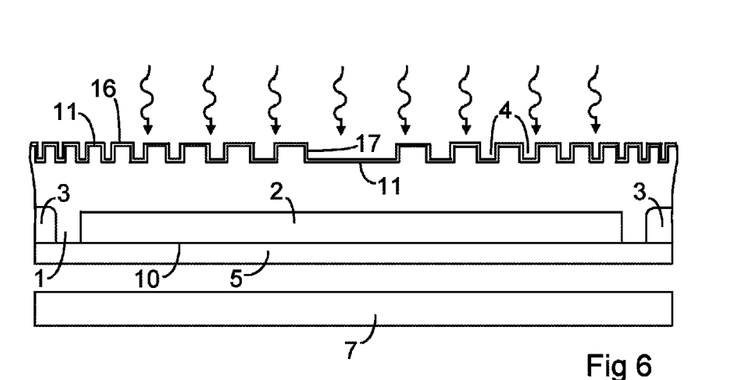
FIG. 6 is a cross section according to FIG. 1 for an embodiment of the semiconductor device comprising a different arrangement of a covering layer.

FIG. 6 is a cross section of a further embodiment of the semiconductor device. Elements of the embodiment according to FIG. 6 that correspond to elements of the embodiment according to FIG. 1 are designated with the same reference numerals. The embodiment according to FIG. 6 comprises a covering layer 16, which does not fill the recesses 4 forming the focusing element 17. The covering layer 16 may in particular be provided to reduce reflection on the surface of the focusing element 17 and may be a thin antireflection coating, for instance. The covering layer 16 may especially be a conformal film having essentially the same thickness on the entire interface with the focusing element 17. The remaining volumes of the recesses 4 may be filled with ambient air, for instance. Such a cover layer 16 that does not fill the recesses 4 can also be applied with the embodiments comprising a cover 8 on or above the main surface 10 of the semiconductor substrate 1 according to FIGS. 2 and 3. The difference between embodiments thus obtained and the structures shown in FIGS. 2 and 3, respectively, can immediately be inferred from a comparison of FIGS. 1 and 6.

Methods of producing a semiconductor device with focusing element are described in the following in conjunction with FIGS. 7 to 17, which are cross sections of typical intermediate products of the described methods.

Figure 7:
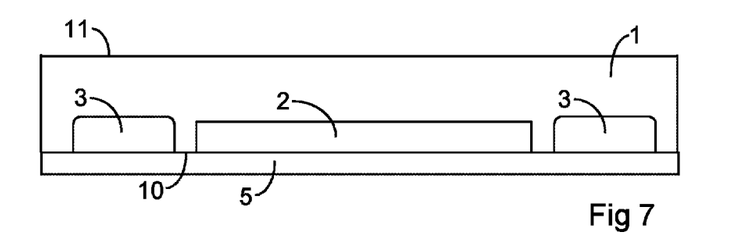
FIG. 7 is a cross section of an intermediate product of a method of producing the semiconductor device.

FIG. 7 is a cross section of a semiconductor substrate 1 provided with the sensor or sensor array 2 and the integrated circuit 3 at the main surface 10. The semiconductor substrate 1 may be part of a wafer, wherein a plurality of sensors or sensor arrays 2 and a plurality of integrated circuits 3 are produced for a plurality of semiconductor devices. The integrated circuit 3 may be produced in a CMOS process, for example. A wiring layer 5 can be applied as usual by an arrangement of structured metal layers with dielectric material in between and with vertical electrical connections formed by plugs, for example. The details of the wiring layer 5 are not relevant and are therefore omitted.

Figure 8:
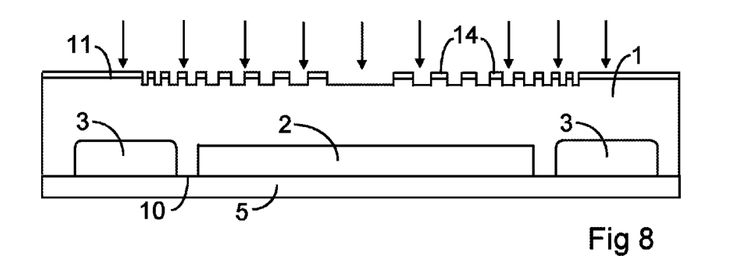
FIG. 8 is a cross section according to FIG. 7 in a state during etching of the focusing element.

FIG. 8 is a cross section according to FIG. 7 for a later stage of the method and shows the etching of the focusing element. To this end, a mask 14, which may be a resist mask, for instance, is applied to the further main surface 11 opposite the main surface 10. The mask 14 has openings in the regions where the trenches forming the focusing element are to be etched. In FIG. 8 the attack of the etching agent is indicated with arrows pointing downwards.

Figure 9:
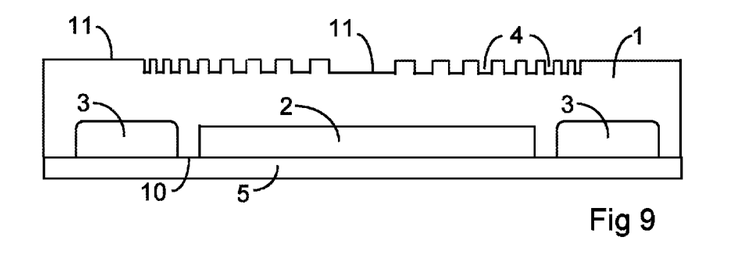
FIG. 9 is a cross section according to FIG. 8 after the etching process.

FIG. 9 is a cross section according to FIG. 8 after the etching step. When the recesses 4 in the shape of trenches forming the focusing element 17 have reached their final depths, the etching process is stopped and the mask 14 is removed. Then the optional covering layer 16 and/or the optional bump contacts 6 can be applied. The wafer can subsequently be divided into single semiconductor devices, which can be mounted on a board 7 according to FIG. 1.

Figure 10:
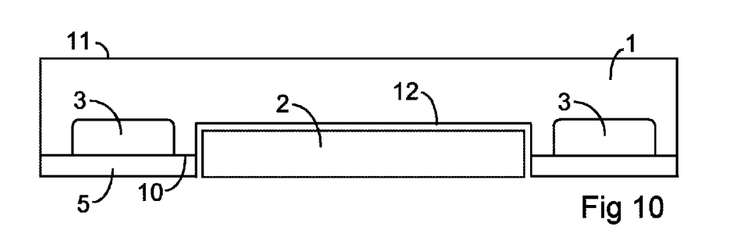
FIG. 10 is a cross section of an intermediate product according to FIG. 7 for a further embodiment.

FIG. 10 is a cross section according to FIG. 7 for an embodiment according to FIG. 2. A cavity 12 is etched into the main surface 10 of the semiconductor substrate 1, and the sensor or sensor array 2 is arranged in the cavity 12.

Figure 11:
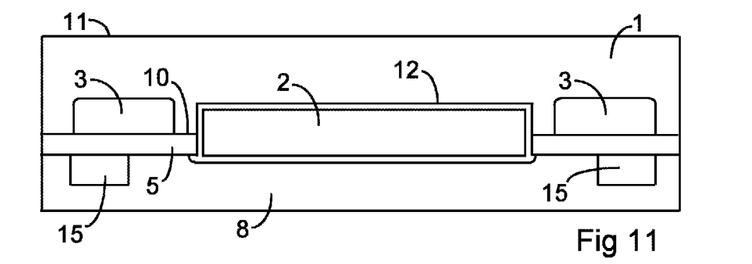
FIG. 11 is a cross section according to FIG. 10 after the application of a cover above the sensor or sensor array.

FIG. 11 is a cross section according to FIG. 10 after the application of a cover 8, which can be a rigid cover like a further substrate or wafer, for example. The cover 8 is arranged on or above the main surface 10 and can especially be bonded to the wiring layer 5 by a conventional bonding process, for example. A dedicated bonding layer, which may be an oxide of the semiconductor material, for instance, may be applied between the wiring layer 5 and the cover 8 for this purpose. FIG. 11 shows how the cover 8 covers or closes the cavity 12. The cover 8 can be provided with recesses 15 for the accommodation of optional bump contacts.

Figure 12:
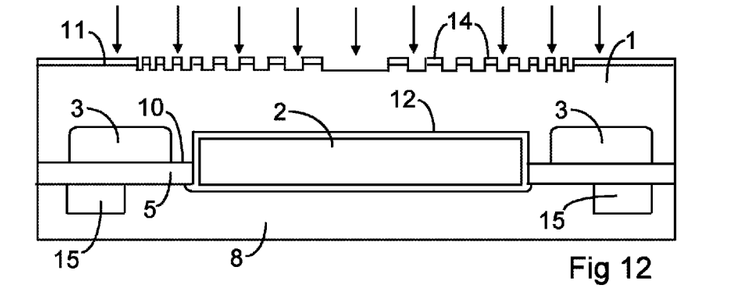
FIG. 12 is a cross section according to FIG. 11 in a state during etching of the focusing element.

FIG. 12 is a cross section according to FIG. 11 for a later stage of the method and shows the etching of the focusing element. The elements of the cross section of FIG. 12 that correspond to elements of the cross section of FIG. 11 are designated with the same reference numerals. FIG. 12 shows the mask 14 with openings in the regions where the trenches forming the focusing element are to be etched. The attack of the etching agent is indicated with arrows pointing downwards.

Figure 13:
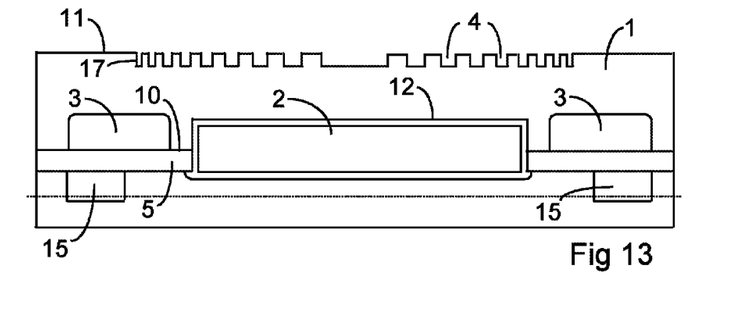
FIG. 13 is a cross section according to FIG. 12 after the etching process.

FIG. 13 is a cross section according to FIG. 12 after the etching step forming the recesses 4 of the focusing element 17. The mask 14 has been removed. The recesses 15 can be opened by thinning the cover 8 to the level indicated in FIG. 13 by the dotted line. This may be performed by grinding the cover 8 back, for example, until the intended thickness is obtained. Bump contacts 6 can be arranged in the opened recesses 15. The wafer is then divided into single semiconductor devices, which can be mounted on a board 7 according to FIG. 2.

Figure 14:
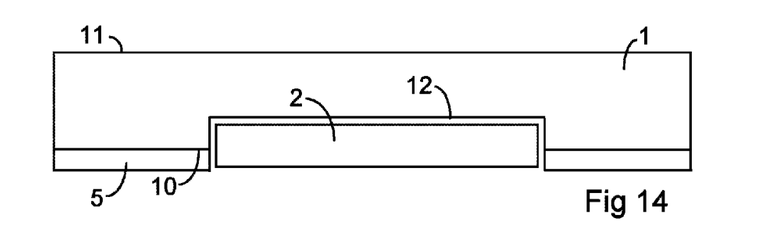
FIG. 14 is a cross section of an intermediate product according to FIG. 10 for a further embodiment.

FIG. 14 is a cross section according to FIG. 10 for the embodiment according to FIG. 3. A cavity 12 is etched into the main surface 10 of the semiconductor substrate 1, and the sensor or sensor array 2 is arranged in the cavity 12. In this embodiment it is not necessary to integrate an electronic circuit in the semiconductor substrate 1 for the operation of the sensor or sensor array 2. However, an integrated circuit 3 may be provided in the semiconductor substrate 1 as in the embodiment according to FIG. 2 and FIGS. 10 to 13.

Figure 15:
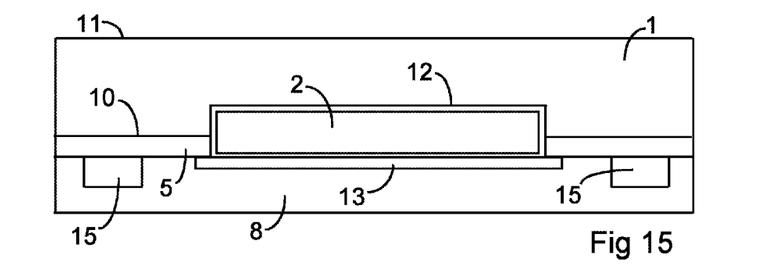
FIG. 15 is a cross section according to FIG. 14 after the application of a cover with an integrated circuit.

FIG. 15 is a cross section according to FIG. 14 after the application of a cover 8, which is provided with the integrated circuit 13 for the operation of the sensor or sensor array 2. The cover 8 may be a further substrate or wafer, for example, and the integrated circuit 13 may be arranged opposite the sensor or sensor array 2. The cover 8 can be bonded to the wiring layer 5 by any conventional bonding process, for example. A dedicated bonding layer, which may be an oxide of the semiconductor material, for instance, may be applied between the wiring layer 5 and the cover 8 for this purpose. FIG. 15 shows how the cover 8 covers or closes the cavity 12. The cover 8 can be provided with recesses 15 for the accommodation of bump contacts as in the method according to FIGS. 10 to 13.

Figure 16:
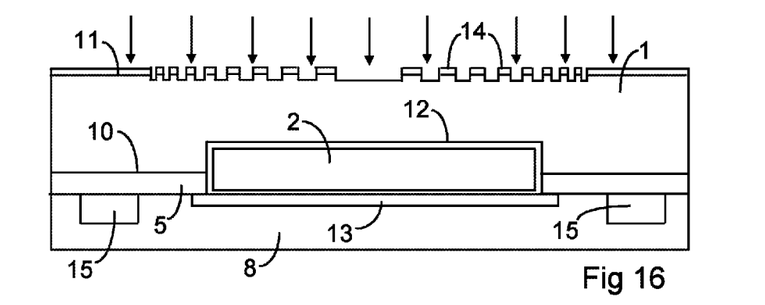
FIG. 16 is a cross section according to FIG. 15 in a state during etching of the focusing element.

FIG. 16 is a cross section according to FIG. 15 showing the etching of the focusing element. The elements of the cross section of FIG. 16 that correspond to elements of the cross section of FIG. 15 are designated with the same reference numerals. FIG. 16 shows the mask 14 with openings in the regions where the trenches forming the focusing element are to be etched. The attack of the etching agent is indicated with arrows pointing downwards.

Figure 17:
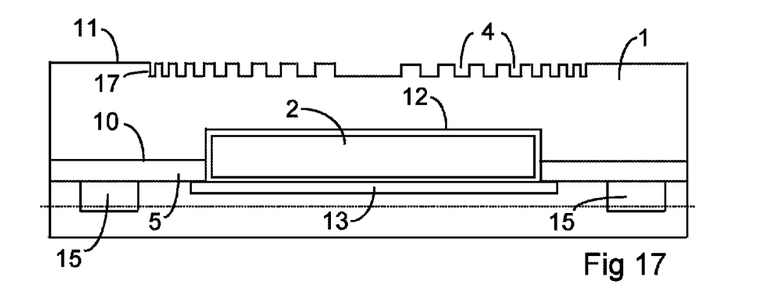
FIG. 17 is a cross section according to FIG. 16 after the etching process.

FIG. 17 is a cross section according to FIG. 16 after the etching step forming the recesses 4 of the focusing element 17. The mask 14 has been removed. The recesses 15 can be opened by thinning the cover 8 to the level indicated in FIG. 17 by the dotted line as in the method according to FIGS. 10 to 13. Bump contacts 6 can be arranged in the opened recesses 15. The wafer is then divided into single semiconductor devices, which can be mounted on a board 7 according to FIG. 3.

The described method allows the fabrication of an integrated focusing element at low cost. It can be employed in many applications to increase the intensity of the radiation impinging on the photosensor and to enhance the performance of the photosensor accordingly.

The invention claimed is:

1. A semiconductor device, comprising:
a semiconductor substrate with a main surface and a further main surface opposite the main surface;
a sensor or sensor array at the main surface;
an integrated circuit at or above the main surface;
a focusing element at the further main surface, the focusing element being provided by recesses formed within the semiconductor material of the substrate at the further main surface;
a cover arranged at the main surface; and
a cavity in the substrate at the main surface of the substrate, the sensor or sensor array being arranged in the cavity, the cover covering or closing the cavity,
wherein the integrated circuit is arranged in the cover, and
wherein the cover is a further semiconductor substrate or wafer.

2. The semiconductor device of claim 1, wherein
the sensor or sensor array is an array of photosensors or photodetectors; and
each of the recesses of the focusing element is provided for more than one of the photosensors or photodetectors.

3. The semiconductor device of claim 1, wherein the focusing element is a diffracting element.

4. The semiconductor device of claim 1, wherein the focusing element is a zone plate comprising a set of radially symmetric Fresnel zones.

5. The semiconductor device of claim 4, further comprising:
a covering layer on the focusing element, the covering layer generating a phase shift zone plate.

6. The semiconductor device of claim 1, wherein the focusing element is a Fresnel lens.

7. The semiconductor device of claim 1, further comprising:
a covering layer covering the focusing element without filling the recesses.

8. A method of producing a semiconductor device with focusing element, comprising:

arranging a sensor or sensor array at a main surface of a semiconductor substrate;
providing an integrated circuit at or above the main surface;
etching a focusing element in the semiconductor material of the substrate at a further main surface of the substrate opposite the main surface; and
applying a cover to the main surface, before the focusing element is etched,
wherein the cover is provided with the integrated circuit,
wherein a cavity is provided in the substrate at the main surface of the substrate, the sensor or sensor array is arranged in the cavity, and the cover is provided to cover or close the cavity, and
wherein the cover is a further semiconductor substrate or wafer.

9. The method of claim 8, wherein the focusing element is etched in the shape of a zone plate or Fresnel lens.

10. A semiconductor device, comprising:
a semiconductor substrate with a main surface and a further main surface opposite the main surface;
a sensor or sensor array at the main surface;
a cover at the main surface;
an integrated circuit in the cover;
recesses formed within the semiconductor material of the substrate at the further main surface, the recesses providing a focusing element; and
a cavity in the substrate at the main surface of the substrate, the sensor or sensor array being arranged in the cavity, the cover covering or closing the cavity,
wherein the cover is a further semiconductor substrate or wafer.

11. The semiconductor device of claim 10, wherein
the sensor or sensor array is an array of photosensors or photodetectors; and
each of the recesses of the focusing element is provided for more than one of the photosensors or photodetectors.

12. The semiconductor device of claim 10, wherein the focusing element is a diffracting element.

13. The semiconductor device of claim 10, wherein the focusing element is a zone plate comprising a set of radially symmetric Fresnel zones.

14. The semiconductor device of claim 13, further comprising:
a covering layer on the focusing element, the covering layer generating a phase shift zone plate.

15. The semiconductor device of claim 10, wherein the focusing element is a Fresnel lens.

16. The semiconductor device of claim 10, further comprising:
a covering layer covering the focusing element without filling the recesses.

* * * * *